United States Patent
Chen et al.

(10) Patent No.: US 10,077,184 B2
(45) Date of Patent: Sep. 18, 2018

(54) MEMS AUTOMATIC ALIGNMENT HIGH-AND-LOW COMB TOOTH AND MANUFACTURING METHOD THEREOF

(71) Applicant: Wuxi Wio Technology Co., Ltd., Jiangsu (CN)

(72) Inventors: Qiao Chen, Jiangsu (CN); Huikai Xie, Jiangsu (CN)

(73) Assignee: Wuxi Wio Technolgy Co., Jiangsu (CN)

( * ) Notice: Subject to any disclaimer, the term of this patent is extended or adjusted under 35 U.S.C. 154(b) by 0 days.

(21) Appl. No.: 15/503,192

(22) PCT Filed: May 11, 2015

(86) PCT No.: PCT/CN2015/078711
§ 371 (c)(1),
(2) Date: Feb. 10, 2017

(87) PCT Pub. No.: WO2016/065887
PCT Pub. Date: May 6, 2016

(65) Prior Publication Data
US 2017/0233244 A1    Aug. 17, 2017

(30) Foreign Application Priority Data
Oct. 30, 2014    (CN) .......................... 2014 1 0599134

(51) Int. Cl.
*B61B 3/00*     (2006.01)
*B81B 3/00*     (2006.01)
*B81C 1/00*     (2006.01)

(52) U.S. Cl.
CPC .......... *B81B 3/0037* (2013.01); *B81C 1/0015* (2013.01); *B81B 2201/0235* (2013.01);
(Continued)

(58) Field of Classification Search
None
See application file for complete search history.

(56) References Cited

U.S. PATENT DOCUMENTS 5,998,906 A * 12/1999 Jerman .................. G02B 6/357
                                                 310/309
6,067,858 A *  5/2000 Clark ................. G01C 19/5719
                                                 73/504.16
(Continued)

FOREIGN PATENT DOCUMENTS

CN    101907769 A    12/2010
CN    102564650 A     7/2012
(Continued)

*Primary Examiner* — Sitaramarao S Yechuri
(74) *Attorney, Agent, or Firm* — Miller Law Group, PLLC

(57) ABSTRACT

A MEMS self-aligned high-and-low comb tooth and manufacturing method thereof, the comb tooth having a lifting structure, the lifting structure generating a displacement in the vertical direction to drive the movement of a movable comb tooth or a fixed comb tooth attached thereto. The manufacturing method thereof adopts a silicon wafer, the lifting structure and the comb tooth are sequentially formed on a mechanical structure layer, the fixed comb tooth and the movable comb tooth are formed with the same etching process, and the stress in the lifting structure displaces the fixed comb tooth and the movable comb tooth in the vertical direction, thus forming the self-aligned high-and-low comb tooth.

9 Claims, 4 Drawing Sheets

(52) U.S. Cl.
CPC . *B81B 2201/0242* (2013.01); *B81B 2201/042* (2013.01); *B81B 2203/0118* (2013.01); *B81B 2203/0136* (2013.01); *B81C 2201/013* (2013.01)

(56) References Cited

U.S. PATENT DOCUMENTS

| | | | | |
|---|---|---|---|---|
| 6,661,069 B1* | 12/2003 | Chinthakindi | ......... | H01G 5/011 257/415 |
| 6,933,165 B2* | 8/2005 | Musolf | ................ | B82Y 30/00 438/50 |
| 6,996,306 B2* | 2/2006 | Chen | ..................... | G02B 6/357 385/18 |
| 7,005,775 B2* | 2/2006 | Wan | ..................... | B81B 3/0035 310/309 |
| 7,131,848 B2* | 11/2006 | Lindsey | ............. | G01R 1/06733 257/E23.068 |
| 7,538,927 B1 | 5/2009 | Fu | | |
| 7,732,990 B2* | 6/2010 | Nishigaki | ............. | B81B 3/0072 310/317 |
| 8,138,564 B2* | 3/2012 | Kosaka | ................ | H04N 5/2257 257/414 |
| 8,525,393 B1* | 9/2013 | Grbovic | ................... | H02N 2/18 310/311 |
| 8,624,616 B2* | 1/2014 | Chou | ................ | G01R 1/06738 324/755.01 |
| 2003/0160539 A1* | 8/2003 | Ma | .......................... | H03H 9/24 310/307 |
| 2003/0223678 A1* | 12/2003 | Hunter | ................ | G02B 6/3576 385/18 |
| 2004/0165243 A1* | 8/2004 | Helmbrecht | ........... | G02B 26/06 359/224.1 |
| 2005/0002079 A1* | 1/2005 | Novotny | ............. | B81C 1/00246 359/245 |
| 2005/0002084 A1* | 1/2005 | Wan | ..................... | B81B 3/0035 359/291 |
| 2005/0047721 A1* | 3/2005 | Chen | ..................... | G02B 6/357 385/40 |
| 2005/0140987 A1* | 6/2005 | Xie | ....................... | B81B 3/0018 356/512 |
| 2006/0003482 A1* | 1/2006 | Chinthakindi | ........... | H01G 5/18 438/52 |
| 2006/0024989 A1* | 2/2006 | Lindsey | ............. | G01R 1/06733 439/66 |
| 2006/0141659 A1* | 6/2006 | Gan | ................... | G02B 26/0866 438/51 |
| 2006/0181379 A1* | 8/2006 | Schwartz | ........... | H01H 59/0009 335/78 |
| 2007/0068308 A1* | 3/2007 | Greywall | ................ | B81B 3/004 74/490.1 |
| 2007/0228887 A1* | 10/2007 | Nishigaki | ............. | B81B 3/0072 310/332 |
| 2009/0322365 A1* | 12/2009 | Garmire | ................ | B81C 99/005 324/750.3 |
| 2010/0194499 A1* | 8/2010 | Wang | ..................... | H03H 9/172 333/187 |
| 2010/0264777 A1* | 10/2010 | Medhat | ................. | B81B 3/0037 310/300 |
| 2010/0307150 A1* | 12/2010 | Wu | ........................ | B81B 3/0024 60/528 |
| 2011/0210800 A1* | 9/2011 | Kaajakari | .......... | G01C 19/5621 331/156 |
| 2011/0241839 A1* | 10/2011 | Lal | .......................... | G21H 1/02 340/10.1 |
| 2012/0120470 A1* | 5/2012 | Kitazawa | ............... | H02N 1/006 359/200.1 |
| 2014/0245831 A1* | 9/2014 | Furuhata | ............... | G01C 19/574 73/504.12 |
| 2014/0305478 A1* | 10/2014 | Carberry | ................ | H01L 35/34 136/200 |
| 2015/0056733 A1* | 2/2015 | Lo | ........................ | B81C 1/0069 438/51 |
| 2015/0298322 A1* | 10/2015 | Morris | ....................... | B25J 7/00 294/86.4 |

FOREIGN PATENT DOCUMENTS

| | | |
|---|---|---|
| CN | 104007549 A | 8/2014 |
| CN | 104370272 A | 2/2015 |

\* cited by examiner

MEMS AUTOMATIC ALIGNMENT HIGH-AND-LOW COMB TOOTH AND MANUFACTURING METHOD THEREOF

BACKGROUND OF THE INVENTION

Field of the Invention

The present invention discloses MEMS (Micro-Electromechanical Systems) self-aligning high/low comb teeth and a manufacturing method of the comb teeth, and belongs to the MEMS field.

Background Art

The MEMS (Micro-Electromechanical systems) field is a new field of manufacturing micro-devices that may integrate the effects of different physical fields. Compared with conventional mechanical devices, MEMS devices are smaller in dimensions, usually at micrometer to millimeter scale. Based on the semiconductor integrated circuit (IC) manufacturing process, MEMS devices can be produced massively at a low cost, utilizing the matured techniques and process in IC production extensively; therefore, the cost-performance of MEMS devices is greatly improved when compared with the "machinery" manufactured with the conventional manufacturing techniques.

Comb teeth structures are widely applied in MEMS devices, such as various capacitive transducers including accelerometers, gyroscopes, etc. and micro-actuators. MEMS comb teeth structures are usually flat, i.e., the movable comb teeth and the fixed comb teeth are in the same plane. Such comb teeth can only be driven to move in the plane. When out-of-plane movement is required, high/low comb teeth, which are also referred to as vertical comb teeth, must be used, i.e., the movable comb teeth and the fixed comb teeth are not in the same plane. High/low comb teeth structures can be used to manufacture scanning micro-mirrors, and are indispensable structures for tri-axial accelerometers and tri-axial MEMS capacitive gyroscopes. However, high/low comb teeth have to be formed by bonding or repeated etching in the process. The process is complex and involves high difficulties, resulting in a low yield ratio.

With the existing high/low comb teeth design, whether bonding is utilized to etch the high/low comb teeth respectively or repeated photo-etching is utilized to etch the high/low comb teeth respectively in the conventional MEMES manufacturing process, high-precision alignment is required. Consequently, the processing requirement is high, and the yield ratio is low. Though the SOI (Silicon-On-Insulator) technique can solve the problem of self-alignment of the comb teeth, it also has drawbacks such as repeated etching and complex processing.

SUMMARY OF THE INVENTION

To overcome the drawbacks in the prior art, the present invention provides MEMS self-aligning high/low comb teeth and a manufacturing method of the comb teeth.

The above-mentioned object of the present invention is attained with the following technical solution:

MEMS self-aligning high/low comb teeth, comprising movable comb teeth, fixed comb teeth, and a lifting structure with one end fixed to a substrate and the other end connected to the movable comb teeth or the fixed comb teeth, the lifting structure comprises at least one bent beam section and at least one straight beam section, the bent beam and the straight beam together form at least one bent folded beam structure, the bent beam makes the folded beam structure displace in the vertical direction, and thereby drives the movable comb teeth/fixed comb teeth connected to the lifting structure to displace out of the plane of the fixed comb teeth/movable comb teeth, forming high/low comb teeth.

A key component of the MEMS self-aligning high/low comb teeth is the lifting structure, of which one end is fixed to the substrate and the other end is connected to the movable comb teeth or the fixed comb teeth. The lifting structure drives the comb teeth connected to it to displace in the vertical direction, and thereby the movable comb teeth and the fixed comb teeth are not in the same plane. After the lifting structure is released, the lifting structure generates vertical displacement, making the movable comb teeth and the fixed comb teeth staggered from each other in the vertical direction and thereby forming high/low comb teeth; before the lifting structure is released, the movable comb teeth and the fixed comb teeth are in the same plane; in addition, the movable comb teeth and the fixed comb teeth are formed in one procedure in the process. Therefore, the high/low comb teeth are referred to as self-aligning high/low comb teeth.

In the lifting structure, at least one bent beam is located in front of the bend, and at least one bent beam is located behind the bend.

The lifting structure comprises a uniform and continuous first material layer and a non-continuous and sectional second material layer covering the first material layer, the straight beam comprises the first material layer solely, while the bent beam comprises the first material layer and the covering second material layer.

The first material layer is monocrystalline silicon or polycrystalline silicon.

The second material layer is a single-layer film or a multi-layer film.

The second material layer is one or more layers of metal films, such as aluminum, copper, and gold, etc.

The second material layer is one or more layers of non-metal films, such as silicon dioxide, silicon nitride, or polycrystalline silicon, etc.

The second material layer is a composite film, comprising at least one layer of metal film and one layer of non-metal film.

The self-aligning high/low comb teeth may be used to manufacture MEMS electrostatic actuators or MEMS capacitive displacement transducers that may make out-of-plane movement (in the vertical direction).

Hereunder a manufacturing method of the self-aligning MEMS high/low comb teeth will be described briefly. The silicon wafer to be processed is a SOI (Silicon-On-Insulator) silicon wafer:

a. A film layer is deposited on a monocrystalline silicon component layer on the front side of the SOI, and the film layer is patterned to form a second material layer for the lifting structure, the second material layer is the film layer;

b. The back side of the SOI is cavity-etched to form back cavities, for example, through a deep silicon etching process;

c. The monocrystalline silicon component layer on the front side of the SOI is etched to form comb teeth and a first material layer for the lifting structure, wherein, the SOI component layer is the first material layer of the lifting structure, i.e., the monocrystalline silicon;

d. The folded beam structure is bent locally under the internal stress in the film layer, and the lifting structure composed of the locally bent folded beam structure drives the fixed comb teeth or the movable comb teeth connected to it to move in the vertical direction, and thereby forms self-aligning comb teeth.

As a further optimized solution of the manufacturing method, the air pressure, temperature, and deposition rate are controlled in the film layer growth process, so as to control the stress in the film layer.

With the above-mentioned technical solution, the present invention attains the following beneficial effects: A SOI silicon wafer is utilized in the processing, the monocrystalline silicon component layer on the front side of the SOI is the mechanical structure layer of the MEMS structure, and a lifting mechanism is introduced and is formed together with the comb teeth pairs on the mechanical structure layer; fixed comb teeth and movable comb teeth are formed in the same etching procedure, the fixed comb teeth and the movable comb teeth are driven to displace in the vertical direction under the stress in the lifting structure, and thereby form self-aligning high/low comb teeth. Compared with MEMS of a multi-layer mechanism, the repeated bonding process is omitted, and thereby the manufacturing process is simplified, the processing cost and processing difficulties are greatly reduced, and the yield ratio is improved.

DETAILED DESCRIPTION OF THE PREFERRED EMBODIMENTS

Figure 1A:
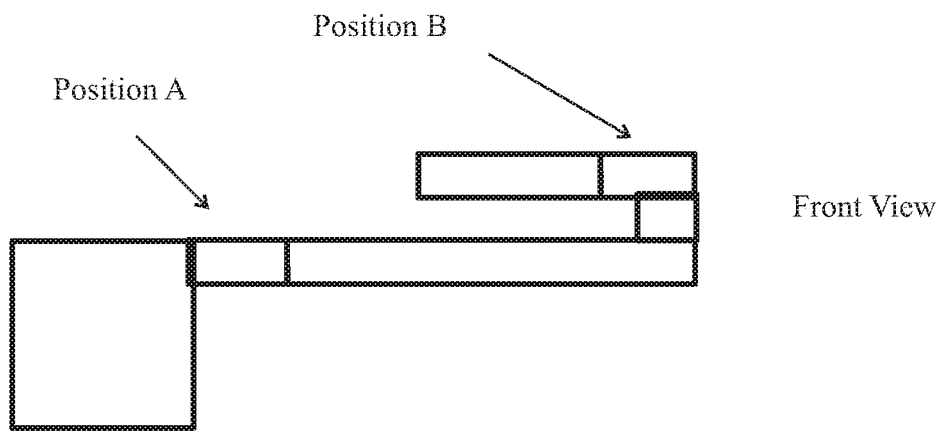
FIGS. 1(a) and 1(b) are front view and side view of a 2-section folded beam lifting structure respectively.
Figure 1B:
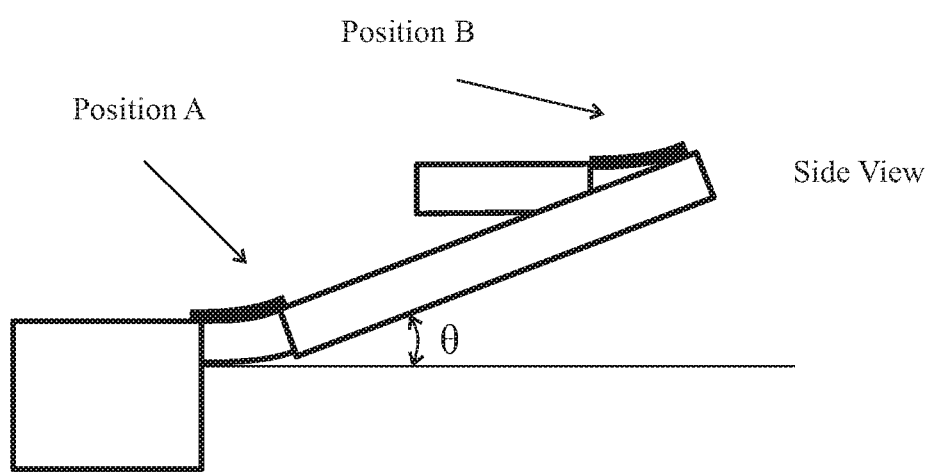

Hereunder the technical solution of the present invention will be detailed, with reference to the accompanying drawings.

A 2-section folded beam lifting structure is shown in FIG. 1. One end of the lifting structure is fixed to a substrate. As shown in the front view in FIG. 1(a), the two sections of the beam of the lifting structure are not completely same with the rest part of the lifting structure in material composition; in addition, one beam section is located in front of the bend (position A), and the other beam section is located behind the bend (position B). A side view of the lifting structure is shown in FIG. 1(b). The lifting structure mainly consists of a thick layer of material (e.g., silicon); the structural beam sections at the positions A and B have an additional film layer when compared with the rest structural beam sections, and the film layer (e.g., metallic material such as aluminum, semiconductor material such as polycrystalline silicon, or dielectric material such as silicon nitride, etc.) is relatively thin. Owing to a Bimorph effect, the entire structure will be bent under stress after the film material layer is deposited on the thick material layer under certain conditions. By controlling the film growth process, including air pressure, temperature, and deposition rate, etc., the curvatures of the structural beam at positions A and B can be controlled. The two bent beam sections is the basis for vertical lifting of the entire structure. Suppose the beam is bent upwards at the position A, then the beam section (a straight beam, because it is made of a single material M1) will be displaced upward;

at that section, lifting is formed, but tilting exists. In view of that, a horizontal beam section, followed by a beam section folded in the reversed direction, are added there. The initial segment of the folded beam (i.e., at the position B) also tilts upwards, but in a direction reversed to the tilting direction of the section A. Thus, vertical displacement is formed at the ends. In addition, the first material layer M1 is utilized as a displacement amplification of the folded beam. After the structure is completely released, vertical displacement in relation to the substrate surface will be obtained at the ends.

Here, the bending angle θ of the flexible Bimorph structural connection part is $$\theta = \frac{l_b}{\rho}, \frac{1}{\rho} = \frac{\beta_b}{t_1 + t_2} \Delta \varepsilon,$$

wherein, ρ is the radius of curvature of the flexible Bimorph structural connection part; Δε; $t_1$ and $t_2$ are the thickness of the material M1 and the film material M2 of the flexible Bimorph structure respectively; $\beta_b$ is the curvature coefficient of the flexible Bimorph structural connection part, and can be obtained from the following formula:

$$\beta_b = 6 * \frac{\left(1 + \frac{t_1}{t_2}\right)^2}{\frac{E'_1}{E'_2} * \left(\frac{t_1}{t_2}\right)^3 + 4 * \left(\frac{t_1}{t_2}\right)^2 + 6 * \frac{t_1}{t_2} + 4 + \left(\frac{E'_1}{E'_2}\right)^{-1} * \left(\frac{t_1}{t_2}\right)^{-1}}$$

Wherein, $E'_1$ and $E'_2$ are biaxial elastic moduli of the material 1 and material 2 of the flexible Bimorph structural connection part, and the values of $E'_1$, and $E'_2$ are determined by the elastic modulus and the Poisson ratio of the film material, as follows:

$$E'_i = \frac{E_i}{1 - v_i}, i = 1, 2:$$

Wherein, $E'_i$, is the elastic modulus of the $i^{th}$ film material layer, and $v_i$ is the Poisson ratio of the $i^{th}$ film material layer.

Figure 1C:
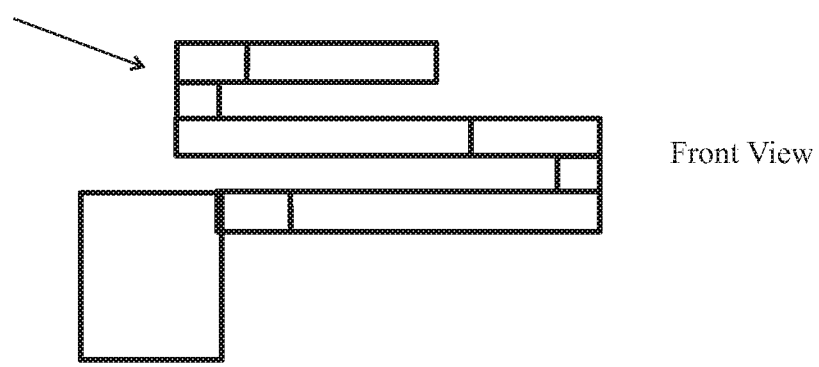
FIGS. 1(c) and 1(d) are front view and side view of a 3-section folded beam lifting structure respectively.
Figure 1D:
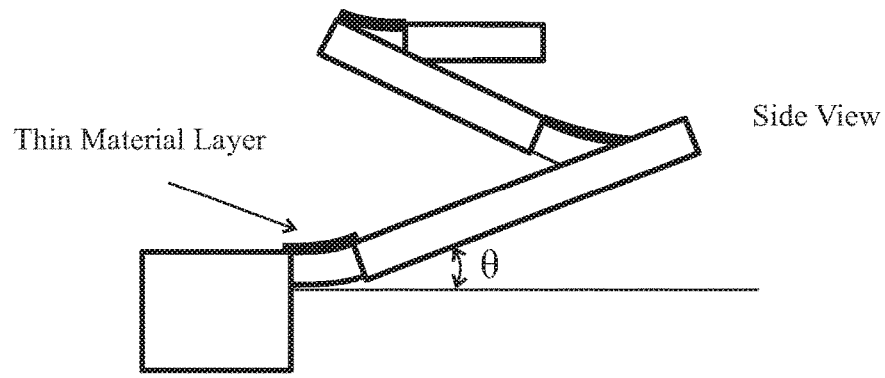

Multi-layer stacked lifting structures can reach different lifting heights. The front view and side view of a 3-section folded beam lifting structure are shown in FIGS. 1(c) and 1(d).

Figure 2:
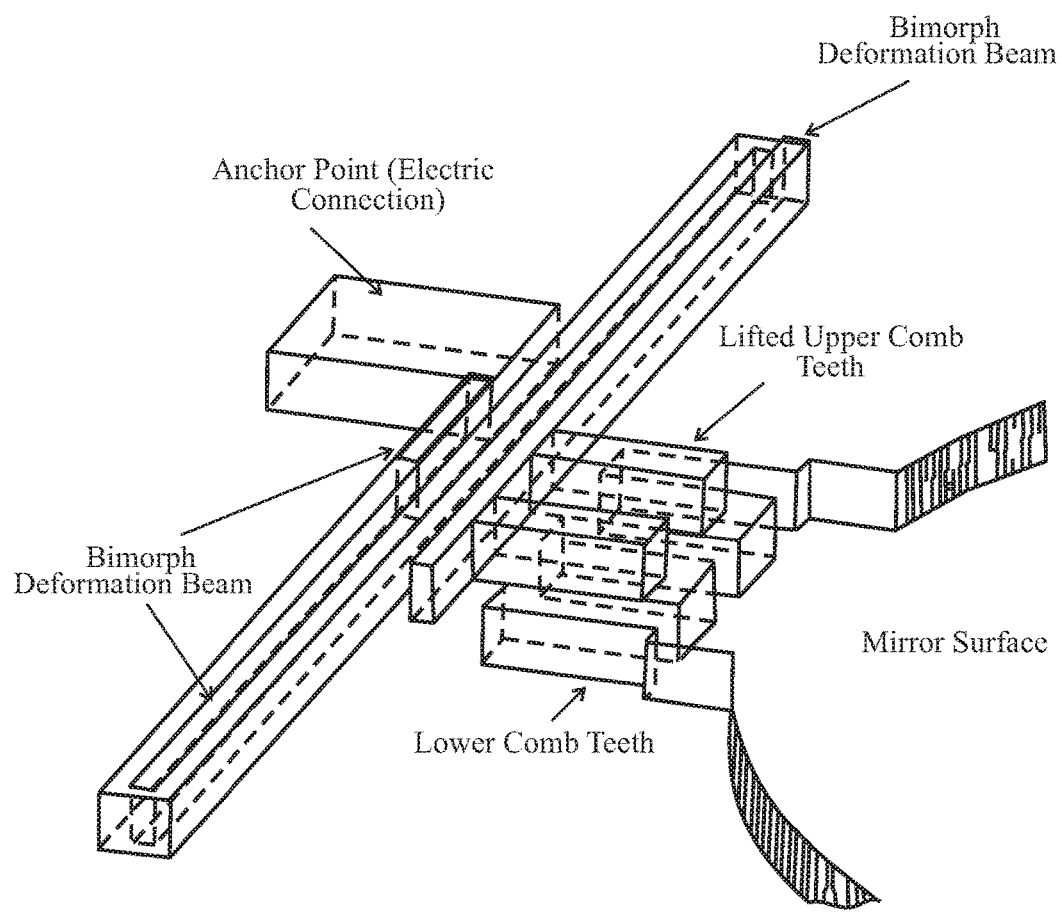
FIG. 2 is a structure diagram of self-aligning high/low comb teeth.

As shown in FIG. 2, the self-aligning high/low comb teeth comprise movable comb teeth, fixed comb teeth, and a lifting structure with one end fixed to a substrate and the other end connected to the movable comb teeth or the fixed comb teeth, the lifting structure comprises at least one bent beam section and at least one straight beam section, the bent beam and the straight beam together form at least one bent folded beam structure, the bent beam makes the folded beam structure displace in the vertical direction, and thereby drives the movable comb teeth/fixed comb teeth connected to the lifting structure to displace out of the plane of the fixed comb teeth/movable comb teeth, forming high/low comb teeth. The silicon wafer to be processed is a SOI (Silicon-On-Insulator) silicon wafer. A second material layer is deposited and patterned on a monocrystalline silicon component layer on the front side of the SOI, the folded beam structure is bent locally under the internal stress in the second material layer, and the lifting structure formed by the locally bent folded beam structure (i.e., the Bimorph deformation beam in the FIG. 2) drives the fixed comb teeth or the movable comb teeth connected to the lifting structure to displace in the vertical direction, and thereby forms self-aligning comb teeth.

Figure 3A:
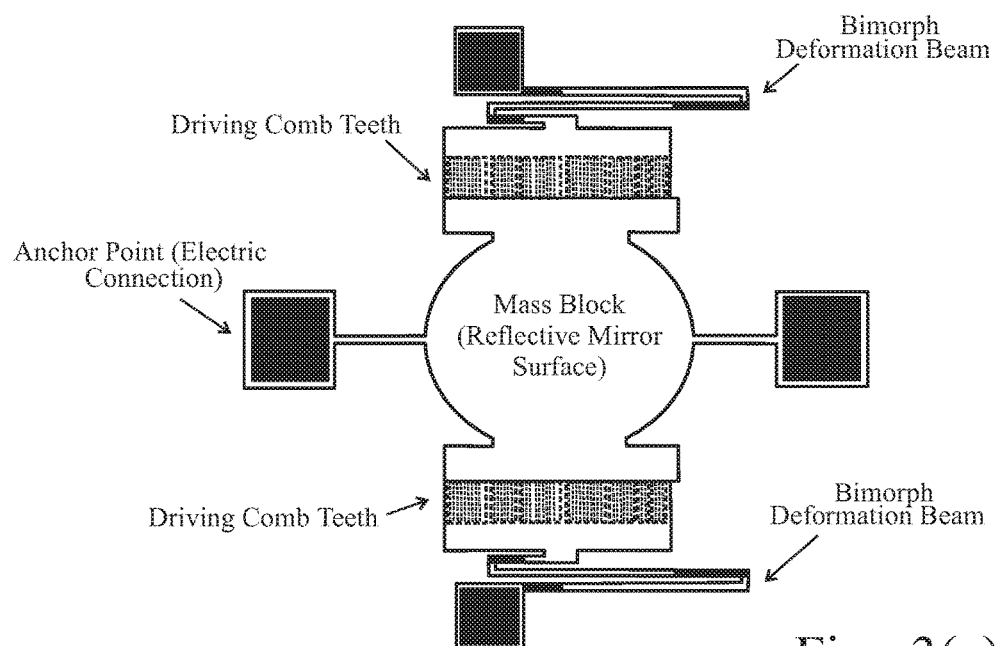
FIGS. 3(a) and 3(b) show a MEMS electrostatic actuator and a MEMS capacitive displacement transducer respectively, which employs self-aligning high/low comb teeth.

FIG. 3(a) shows a MEMS electrostatic actuator that is manufactured utilizing the MEMS self-aligning high/low comb teeth and can make out-of-plane movement. The mechanical structural layers include: a mass block (reflective mirror surface), anchor points for fixing the mass block, anchor points for fixing self-aligning high/low comb teeth, and a connection beam that flexibly connects the mass block with the anchor points. The driving comb teeth are the above-mentioned MEMS self-aligning high/low comb teeth, including fixed comb teeth attached to the edges of the mass block, movable comb teeth corresponding to the fixed comb teeth, and the movable end of a lifting mechanism connected with the movable comb teeth; a deformation film layer is deposited on the mechanical structural layer at the joints between adjacent folded beams; the folded beams are bent locally under the stress of the deformation film layer and thereby form a Bimorph deformation beam.

Figure 3B:
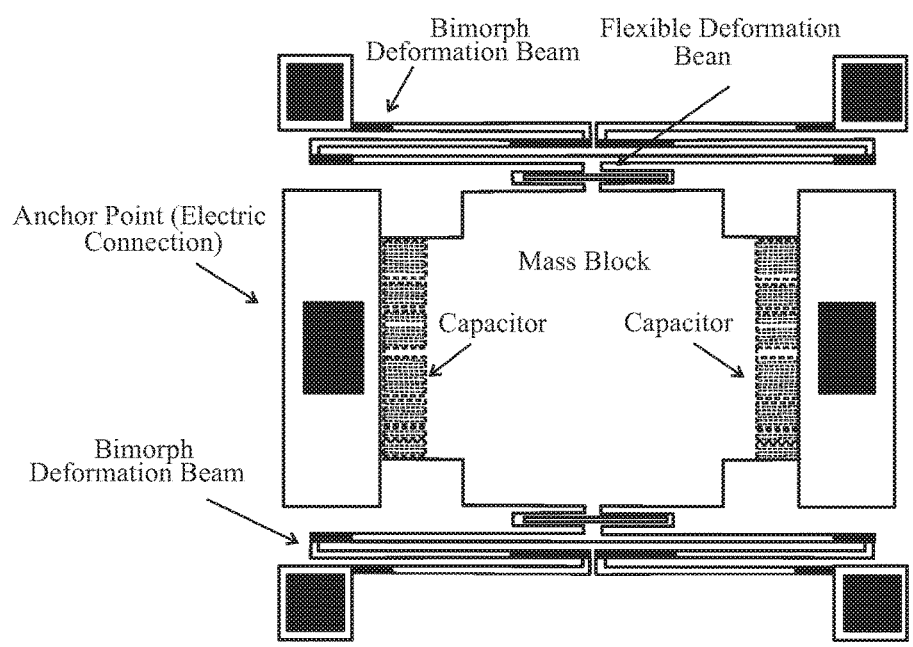

FIG. 3(b) shows a MEMS capacitive displacement transducer that is manufactured utilizing the MEMS self-aligning high/low comb teeth and can measure out-of-plane movement, comprising a lifting structure, a flexible deformation beam, a comb teeth-type capacitor, and electrical connection points. After the comb teeth are lifted by the lifting structure, a high/low comb teeth-type capacitor can be formed. Any variation of the height of the lifting structure can be detected by detecting the variation of the capacitance between the comb teeth structures. In addition, by changing the flexible beam structure, physical quantities such as height variation and rotation angle variation, etc., can be detected.

In summary, in the present invention, high/low comb teeth are formed in a single deep silicon etching procedure, a lifting mechanism is introduced and is formed together with the comb teeth on a mechanical structure layer sequentially; thus, self-aligning high/low comb teeth are formed, without processing through a repeated etching process; compared with MEMS of a multi-layer mechanism, which is formed through a repeated bonding process, the manufacturing process is simplified, and thereby the processing cost and processing difficulties are greatly reduced, and the yield ratio is improved.

It will be understood that changes in the details, materials, steps and arrangements of parts which have been described and illustrated to explain the nature of the invention will occur to and may be made by those skilled in the art upon a reading of this disclosure within the principles and scope of the invention. The foregoing description illustrates the preferred embodiments of the invention; however, concepts, as based upon the description, may be employed in other embodiments without departing from the scope of the invention. The invention is not otherwise limited, except for the recitation of the claims set forth below.

The invention claimed is:

1. MEMS self-aligning high/low comb teeth, comprising movable comb teeth, fixed comb teeth, and a lifting structure with one end fixed to a substrate and the other end connected to the movable comb teeth, wherein, the lifting structure comprises at least one bent beam section and at least one straight beam section, the bent beam and the straight beam together form at least one bent folded beam structure, the bent beam makes the folded beam structure displace in the vertical direction, and thereby drives the movable comb teeth connected to the lifting structure to displace out of the plane of the fixed comb teeth, forming high/low comb teeth, said lifting structure having a uniform and continuous first material layer and a non-continuous and sectional second material layer covering the first material layer, the straight beam including the first material layer solely, while the bent beam includes the first material layer and the covering second material layer.

2. The MEMS self-aligning high/low comb teeth according to claim 1, wherein, in the lifting structure, at least one bent beam is located in front of the bend, while at least one bent beam is located behind the bend.

3. The MEMS self-aligning high/low comb teeth according to claim 1, wherein, the first material layer is monocrystalline silicon or polycrystalline silicon.

4. A manufacturing method of the MEMS self-aligning high/low comb teeth according to claim 3, employing a SOI substrate, and wherein:
  a. depositing a film layer on a monocrystalline silicon component layer on the front side of the SOI substrate, and patterning the film layer to form a second material layer for a lifting structure, the second material layer also being a film layer;
  b. etching the back side of the SOI by deep silicon etching, to form back cavities;
  c. etching the monocrystalline silicon component layer on the front side of the SOI to form comb teeth and a first material layer for the lifting structure;
  d. bending locally the folded beam structure by virtue of the internal stress in the film layer, so that the lifting structure composed of the locally bent folded beam structure drives the fixed comb teeth or the movable comb teeth connected to the lifting structure to move in the vertical direction, and thereby forms self-aligning comb teeth.

5. The manufacturing method of the MEMS self-aligning high/low comb teeth according to claim 4, wherein, the air pressure, temperature, and deposition rate are controlled in the film layer growth process, so as to control the stress in the film layer.

6. The MEMS self-aligning high/low comb teeth according to claim 1, wherein, the second material layer is a single-layer film or multi-layer film.

7. The MEMS self-aligning high/low comb teeth according to claim 6, wherein, the second material layer is one or more layers of metal films.

8. The MEMS self-aligning high/low comb teeth according to claim 6, wherein, the second material layer is one or more layers of non-metal films.

9. The MEMS self-aligning high/low comb teeth according to claim 6, wherein, the second material layer is a composite film comprising at least one layer of metal film and one layer of non-metal film.

* * * * *